United States Patent [19]

Immler

[11] 4,278,937

[45] Jul. 14, 1981

[54] CIRCUIT ARRANGEMENT FOR MONITORING THE PHASE SEQUENCE OF A ROTARY FIELD

[75] Inventor: Josef Immler, Puchheim, Fed. Rep. of Germany

[73] Assignee: Siemens Aktiengesellschaft, Berlin & Munich, Fed. Rep. of Germany

[21] Appl. No.: 14,139

[22] Filed: Feb. 22, 1979

[30] Foreign Application Priority Data

Feb. 24, 1978 [DE] Fed. Rep. of Germany ....... 2808085

[51] Int. Cl.³ ............................................. G01R 25/00
[52] U.S. Cl. ................................. 324/86; 324/83 R
[58] Field of Search ................................ 324/83 R, 86

[56] References Cited

PUBLICATIONS

K. R. Williams, "Primary Power Phase Monitor", IBM Tech. Journal, (Bulletin), vol. 19, No. 11, (Apr. 1977), pp. 4297–4298.
V. A. Corchero, "AC Power Line Monitor", IBM Tech. Bulletin, vol. 16, No. 8, (Jan. 1974), pp. 2760–2761.
Electronics, Jun. 9, 1977, p. 247.

*Primary Examiner*—Michael J. Tokar
*Attorney, Agent, or Firm*—Hill, Van Santen, Steadman, Chiara & Simpson

[57] ABSTRACT

A circuit arrangement for monitoring the phase sequence of a rotary field includes a voltage comparator which is provided and which receives one half-waves from two phases and the other half-wave of a third phase is fed, inverted, to its first input in order to form a measuring voltage and a non-inverted half-wave is fed to a second input as a reference voltage. The voltage comparator is adjusted so that it emits an error signal which characterizes an erroneous phase sequence when the reference voltage exceeds the measuring voltage.

7 Claims, 7 Drawing Figures

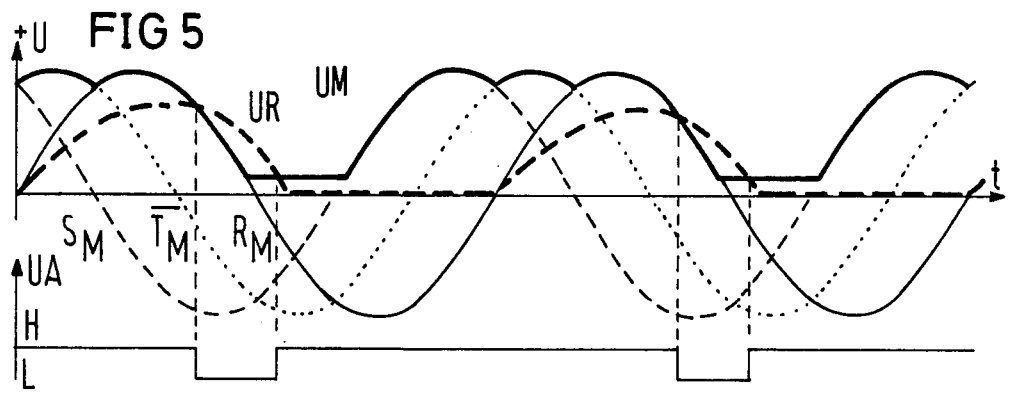
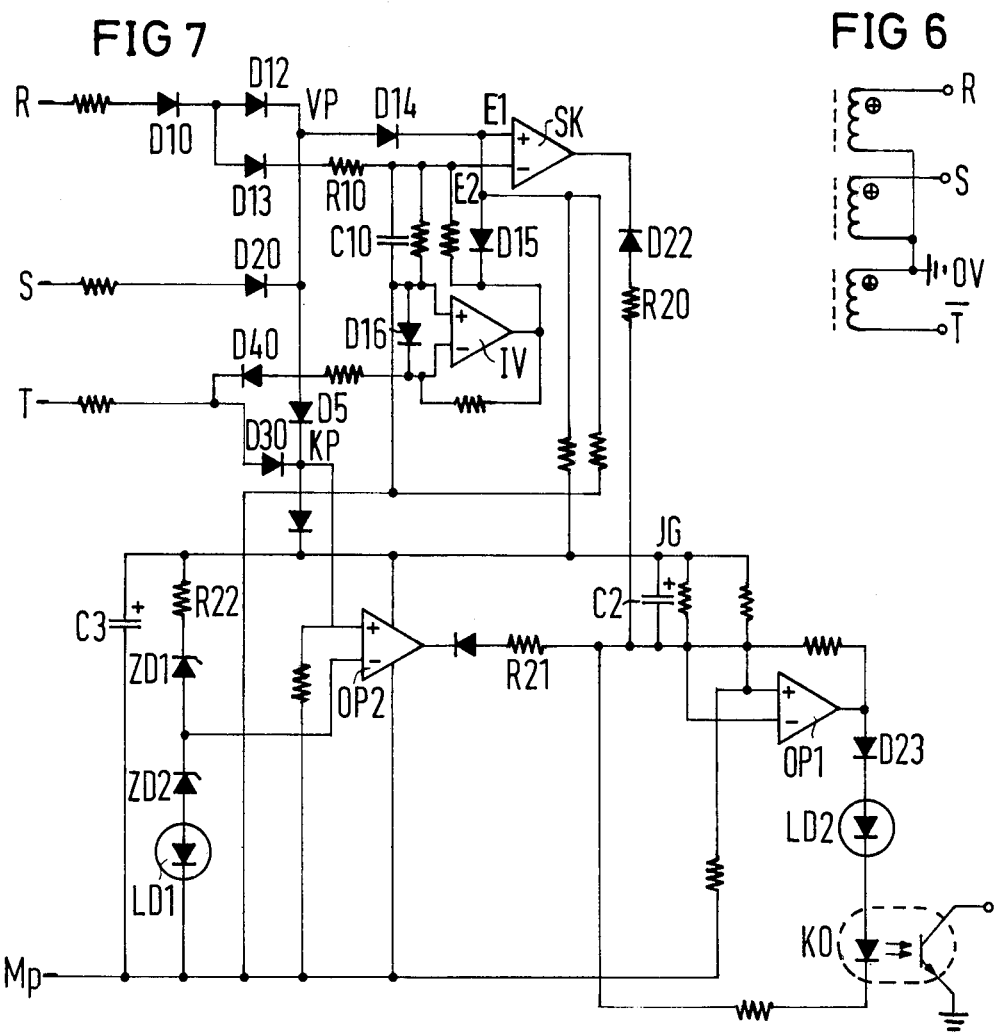

CIRCUIT ARRANGEMENT FOR MONITORING THE PHASE SEQUENCE OF A ROTARY FIELD

BACKGROUND OF THE INVENTION

1. Field of the Invention

The present invention relates to an arrangement for monitoring the phase sequence of a rotary field.

Rotary fields are often utilized in electronic circuits. A trouble-free function of equipment connected to such a rotary field, however, is only possible when the individual phases of the rotary field occur in the correct sequence. For this reason, circuits or rotary field monitoring equipment are necessary which can determine whether the individual phases occur in the correct sequence.

Such a circuit for monitoring the phase sequence of a rotary field is known from the publication "Electronics", June 9, 1977, p. 247. However, the circuit discussed in this article is very expensive.

SUMMARY OF THE INVENTION

The objects of the present invention, therefore, is to provide a circuit arrangement for monitoring the phase sequence of a rotary field which can be constructed with few electronic components.

This object is achieved in that a voltage comparator is provided to which half waves are fed to a first input in order to form a measuring voltage of two phases of the rotary field in an inverted manner, and the other half wave is fed from a third phase, and to which a non-inverted half wave of a phase is fed in a delayed manner as a reference voltage to a second input. The comparator provides an error signal which characterizes an erroneous phase sequence when the reference voltage exceeds the measuring voltage.

In order to produce the reference voltage from a half wave of a phase, the reference voltage can be fed to an RC element.

The half waves of the individual phases can advantageously be obtained with the air of diodes. Then, respectively, two phases are connected, non-inverted, to one connection terminal of respective diodes, whereas a third phase is invertedly connected to one terminal connection of a diode. The other connection terminals of the diodes are connected to one another and the common junction point formed thereby is connected to a first input of the voltage comparator.

However, it is also possible to connect two phases of the rotary field, non-inverted, to one connection terminal of, respectively, one first or second diode, whose other connection terminals are connected with one another, and to only connect this common junction point to a first input of the voltage comparator. The third phase of the rotary field is then connected to an inverter by way of a diode which is connected to the first and second diodes in an opposite polarity fashion, the inverter having an output which is also connected to the first input of the voltage comparator.

It is highly advantageous to employ an arrangement constructed in accordance with the present invention within a rotary field monitor in which the failure of a phase can also be determined. Then, the output of the voltage comparator is connected to an integrator, whose output is connected to an operational amplifier. The output of this operational amplifier, a first operational amplifier, is connected to an output circuit in which also a display circuit is connected containing, for example, a luminous diode. The input of the integrator is additionally connected to the output of an additional operational amplifier, whose first input is connected to a junction, formed by the connecting point of the first and second diodes and a connection terminal of a diode which is homogeneously poled with respect to the first and second diodes. This diode having another connection terminal which is connected to the third phase. The second input of the additional operational amplifier is connected to a voltage divider in order to form a comparator voltage, the divider also being connected to the junction and a capacitor being connected in parallel therewith.

A luminous diode can advantageously be arranged in the voltage divider, the diode being formed which displays an indication that the rotary field monitor is in operation.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 5 is a graphic illustration of the voltage waveforms at the inputs and output of a voltage comparator employed in practicing the present invention;

FIG. 6 illustrates a circuit for inverting a phase of the rotary field; and

FIG. 7 is a schematic circuit diagram illustrating a rotary field monitor constructed in accordance with the present invention.

DESCRIPTION OF THE PREFERRED EMBODIMENTS

Figure 1:
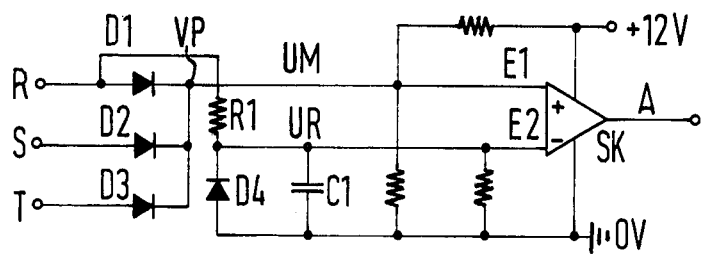
FIG. 1 is a schematic circuit diagram of an arrangement for monitoring a rotary field, the arrangement being constructed in accordance with the principles of the present invention.

The arrangement constructed in accordance with FIG. 1, with the aid of which the phase sequence of a rotary field can be monitored, comprises a voltage comparator SK. A measuring voltage UM is connected to a first input E1 of the voltage comparator, the measuring voltage being formed by half waves of two phases and by the other inverter half wave of a third phase. In the exemplary embodiment illustrated in FIG. 1, the positive half waves of the phases R and S and the positive half wave of an inverted phase $\overline{T}$ are called upon in order to form the measuring voltage UM. Thereto, the phases R,S,$\overline{T}$ are respectively fed to a plurality of diodes D1, D2 and D3, whose other terminals are connected in common to form a junction VP, which junction is connected to a first input E1 of the voltage comparator SK.

A reference voltage UR is connected to a second input E2 of the comparator SK. The reference voltage UR is obtained with the aid of a half wave of a non-inverted phase which is fed to a RC element which includes a resistor R1 and a capacitor C1. The connected phase is somewhat delayed, for example, by approximately 30° by the RC element R1.

A diode D4 which is connected between the resistor R1 and the capacitor C1 is used for the voltage limitation during the negative half cycle of the phase R. The additionally provided resistors are employed for adjusting the operating point of the voltage comparator SK. The operating wave of the arrangement according to FIG. 1 is illustrated with the aid of the voltage diagrams of FIGS. 2-5. In these graphic illustrations, voltages are plotted with respect to time t.

Figure 2:
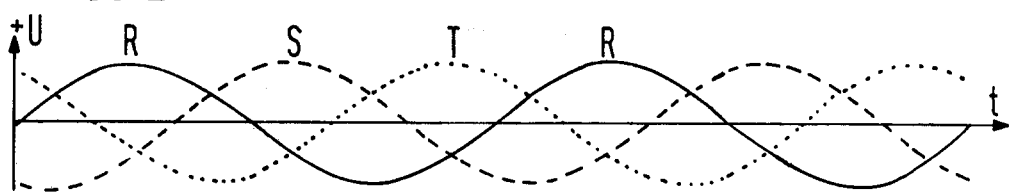
FIG. 2 is a graphic illustration of a rotary field having correct phase positions.
Figure 3:
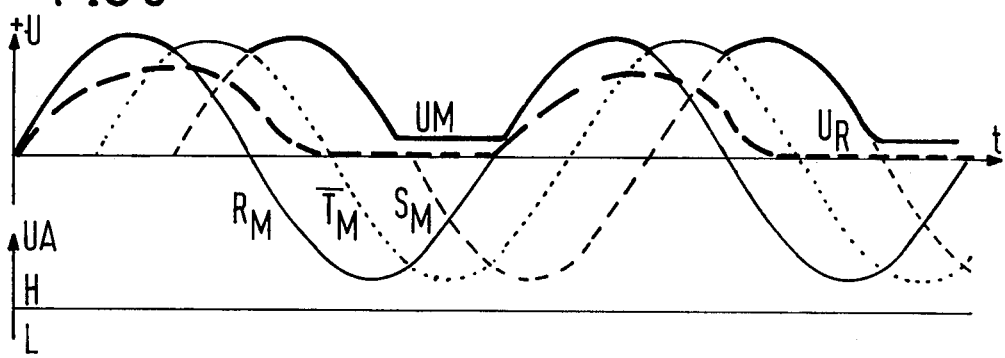
FIG. 3 is a graphic illustration of voltage waveforms at the inputs and the output of the voltage comparator employed in practicing the present invention.

In FIG. 2, a rotary field results in which the individual phases R,S,T occur in correct sequence. In FIG. 2, the phase R is drawn out in solid lines, the phase S is a broken line, and the phase T is illustrated as a dotted line. If such a rotary field is connected to the circuit illustrated in FIG. 1, voltage waveforms result at the inputs E1 and E2 and at the output A of the voltage comparator as illustrated in FIG. 3. In FIG. 3, the measuring voltage UM is illustrated in a solid line at the input E1, whereas the reference voltage UR at the input E1 of the voltage comparator SK is illustrated in dashes. The individual phases R,S and T, and inverted $\overline{T}$ are also plotted in FIG. 3.

From FIG. 3 it can be seen that the measuring voltage UM always proceeds above the reference voltage UR with a correct phase sequence of the rotary field. At the output of the voltage comparator SK, an output voltage UA occurs which always has a value of H.

Figure 4:
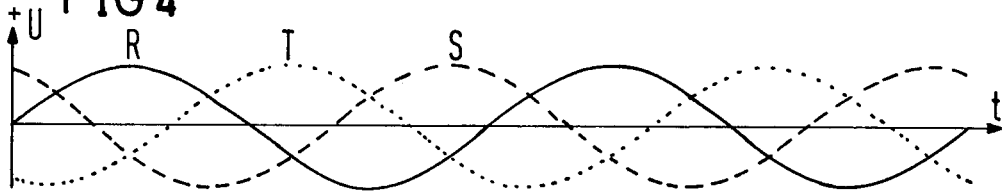
FIG. 4 is a graphic illustration of a rotary field having an incorrect phase sequence.

The conditions change when the phases of a rotary field no longer occur in correct sequence. Such a case is illustrated in FIG. 4. In FIG. 4, the phase T follows the phase R and subsequently the phase S follows the phase T.

The voltage conditions having the phase sequence of FIG. 4 at the input and at the output of the voltage comparator SK result as illustrated in FIG. 5. In FIG. 5, the measuring voltage UR and the waveforms of the phase S, the phase R and the phase T is again illustrated. From FIG. 5 it can be seen that the reference voltage UR proceeds now in specific ranges above the measuring voltage UM. In this case, the reference voltage at the input E2 of the voltage comparator SK becomes temporarily more positive than the measuring voltage UM at the input E1. Consequently, the output voltage UA at the output A of the voltage comparator SK—as illustrated in FIG. 5—alternates temporarily from potential H to a potential L and only returns to the potential H when the reference voltage UR becomes smaller than the measuring voltage UM.

However, the case when the reference voltage UR becomes greater than the measuring voltage UM only occurs when the sequence of the phases of the rotary field is incorrect. Therefore, the arrangement constructed in accordance with FIG. 1 is suited for monitoring of the phase sequence of a rotary field.

The production of the inverted phase $\overline{T}$ can be obtained simply at the secondary windings of a current transducer or voltage transducer. An exemplary embodiment of such structure is illustrated in FIG. 6. In FIG. 6 it is illustrated how the phase R, the phase S and the phase $\overline{T}$ can be produced with the aid of secondary windings of a transformer.

The arrangement of FIG. 1, was somewhat altered, indeed, and all of the phases R,S and T are provided in a non-inverted form. The inversion of the phase T proceeds with the aid of an inverter IV (FIG. 6).

The phase R is fed to a diode D10, the phase S is fed to a first input E1 of a voltage comparator SK by way of a diode D20, and a third phase T is connected to an input of an inverter IV by way of a diode D40. The diode D40 is poled opposite to that of the diodes D10 and D20. Therefore, the positive half cycles are connected from the phases R and S to the voltage comparator SK, whereas the negative half cycle from the phase T is connected to the inverter IV.

The inverter IV inverts the negative half wave which is connected to its input, and feeds the same to the input E1 of the voltage comparator SK by way of a diode D15.

The reference voltage UR at a second input of the voltage comparator SK is again formed with the aid of a RC element, a resistor R10 and a capacitor C10, and is produced from the positive half cycle of the phase R. Thereto, a decoupling diode D13 is connected between the diode D10 and the resistor R10. The diodes D12 and D14 are also decoupling diodes. The diode D16 is a reference diode in order to protect the inverter IV.

The operating characteristics of the circuit just explained, corresponds to that illustrated in FIG. 1, the only difference being that between the two circuits there is an inverter IV which is provided for inverting the negative half wave of the phase T. Therefore, the circuit arrangement only then provides a signal when the phase sequence of the rotary field is not correct.

The signal at the output of the voltage comparator SK is connected to the input of an integrator IG which comprises a capacitor C2 and a resistor R20. The integrator is connected to an input of an operational amplifier OP1. The output of the operational amplifier OP1 is connected to an output circuit in which a luminous diode LD2 is connected. The other input of the operational amplifier OP1 is connected to a voltage divider in order to form a reference voltage.

If an error signal characterizing an erroneous phase sequence occurs at the output of the voltage comparator SK, the operational amplifier OP1 also provides a signal which is fed to the liminous diode LD2 by way of a diode D23. The luminous diode LD2 lights. As the error signals are only present periodically in a rotary field having the wrong phase sequence, however, and as the resistor R20 and the capacitor C2 are correspondingly dimensioned, the luminous diode LD2 will blink in accordance with the error of the phase sequence.

An additional operational amplifier OP2 is provided in order to determine the failure of phases of the rotary field. The output of the operational amplifier OP2 is also connected to the integrator IG, whereby the resistance of the integrator is now formed by a resistor R21. One input of the operational amplifier OP2 is connected to a junction KP. This junction KP is the junction of the connection point VP of the diodes D10 and D20 with the connection terminal of a diode D30, poled in the same direction as the diodes D10 and D20, and to which the phase T is fed. Therefore, the positive half cycles out of the phases R,S and T are connected to the one input of the operational amplifier OP2.

A comparator voltage is connected to the other input of the operational amplifier OP2, which voltage is formed with the aid of a voltage divider which comprises a resistor R22 and a pair of Zener diodes ZD1, ZD2. A filter capacitor C3 is arranged in parallel to this voltage divider. Additionally, a luminous diode LD1 can be arranged in the voltage divider which only lights when the rotary field monitor is connected to at least one phase and to the terminal Mp.

As long as all phases of a rotary field are present, the capacitor C2 of the integrator IG is charged. However, if one phase fails, the capacitor C2 is discharged by way of the operational amplifier OP2. Consequently, a current flows by way of the diode D23 and the luminous diode LD2 in the output branch of the operational amplifier OP1, the current causing the luminous diode LD2 to emit light. The time constant of the integrator is now selected such that the capacitor C2—by the still present phases of the rotary field—can no longer be charged sufficiently that the current would be interrupted by the luminous diode LD2. The consequence is that a continuous current flows through the luminous diode LD2 when at least one phase of the rotary field fails, and therefore the luminous diode lights continuously.

In the foregoing explanation of the circuit illustrated in FIG. 7, only those components necessary for the description of the monitoring function have been referenced. The diodes not referenced are used for decoupling, the resistors are used for adjusting the operating points of the voltage comparator SK, the inverter IV and the operational amplifiers OP1, OP2, etc in order to limit the current.

An optical coupler KO can be arranged in series with the luminous diode LD2. An evaluation circuit can then be connected to the output of the optical coupler in which the signal in the output circuit of the operational amplifier OP1 can be further evaluated.

Although I have described my invention by reference to certain illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for monitoring the phase sequence of a rotary field, comprising:
   a voltage comparator for receiving first half waves from two-phases and the opposite half wave of a third phase, inverted, and responsive thereto to form a measuring voltage;
   means for providing an inverted half wave of the third phase as the reference voltage to said comparator; and
   means for adjusting said voltage comparator to provide an error signal indicating an erroneous phase sequence when the reference voltage exceeds the measuring voltage.

2. The circuit arrangement of claim 1, comprising an RC circuit connected to said voltage comparator at the input which receives the non-inverted half wave forming the reference voltage.

3. The circuit arrangement of claim 1, comprising:
   a plurality of diodes, each of said diodes including a first terminal for receiving a respective phase and a second terminal connected in common with like terminals of the others of said diodes to provide a first input to said first voltage comparator.

4. The circuit arrangement of claim 1, comprising:
   first, second and third diodes, each of said diodes having first and second terminals;
   said first terminals of said first and second diodes adapted to receive respective phases in a non-inverted form and second terminals connected in common to a first input of said voltage comparator; and
   an inverter having an output connected to a second input of said voltage comparator, and an input connected to said third diode.

5. A process for monitoring the phase sequence of a rotary field, comprising the steps of:
   applying first half waves from first and second phases to one input of a comparator to form a measuring voltage;
   applying an inverter half wave of a third phase to another input of said comparator as a reference voltage so that said comparator provides an error signal indicating an erroneous phase sequence when the reference voltage exceeds the measuring voltage;
   applying the error voltage to an integrator;
   applying the output of the integrator to an operational amplifier; applying the output of the operational amplifier to a display circuit;
   providing the first, second and third half waves, through respective diodes, to an input of the additional operational amplifier;
   developing a second input signal for the additional operational amplifier by way of a voltage divider to form a comparator voltage; and applying the output of the additional operational amplifier to an input of the first-mentioned operational amplifier.

6. A three-phase monitoring process according to claim 5, wherein the step of developing a comparator voltage is further defined as:
   providing a luminous diode in the voltage divider.

7. A three-phase monitoring process according to claim 5, comprising the step of:
   applying the output of the first-mentioned operational amplifier to an optocoupler.

* * * * *